United States Patent [19]

Feldman et al.

[11] 4,393,275

[45] Jul. 12, 1983

[54] HEARING AID WITH CONTROLLABLE WIDE RANGE OF FREQUENCY RESPONSE

[75] Inventors: Stanley Feldman, Evanston; Gary Koch, Arlington Heights, both of Ill.

[73] Assignee: Beltone Electronics Corporation, Chicago, Ill.

[21] Appl. No.: 307,009

[22] Filed: Sep. 30, 1981

[51] Int. Cl.³ .............................................. H04M 1/00
[52] U.S. Cl. ................................ 179/1 VL; 179/1 D; 179/1 A; 179/107 R
[58] Field of Search ..... 179/107 R, 107 PC, 107 FD, 179/1 D, 1 A, 1 VL; 330/278, 136

[56] References Cited

U.S. PATENT DOCUMENTS

| | | | |
|---|---|---|---|
| 3,385,937 | 5/1968 | Lafon | 179/107 R |
| 4,176,329 | 11/1979 | Moskowitz | 333/28 T |
| 4,249,042 | 2/1981 | Orban | 179/15.55 R |
| 4,284,965 | 8/1981 | Higashi et al. | 333/28 T |

OTHER PUBLICATIONS

*Radio Amateur's Handbook,* American Radio Relay League, 1979, pp. 2-36-38.
*Radio Shack Dictionary of Electronics,* Howard W. Sams & Co., Inc., 1978, p. 95.

*Primary Examiner*—G. Z. Rubinson
*Attorney, Agent, or Firm*—Allegretti, Newitt, Witcoff & McAndrews, Ltd.

[57] ABSTRACT

A hearing aid circuitry comprising a high pass filter and a low pass filter, for filtering the sound wave signals to permit adjustment of the gain of the high end of the frequency spectrum relative to its low end. The low pass filter is formed of a differential amplifier which performs a subtraction of the sound wave signal and the output signal of the high pass filter. The outputs of both filters are individually added together in proportional quantities by a single control. The use of the differential amplifier, or alternatively, a simple R-C filter of 6 dB fall off, minimizes frequency effects in the output signal in the frequency range where the high pass filter and low pass filter overlap.

5 Claims, 3 Drawing Figures

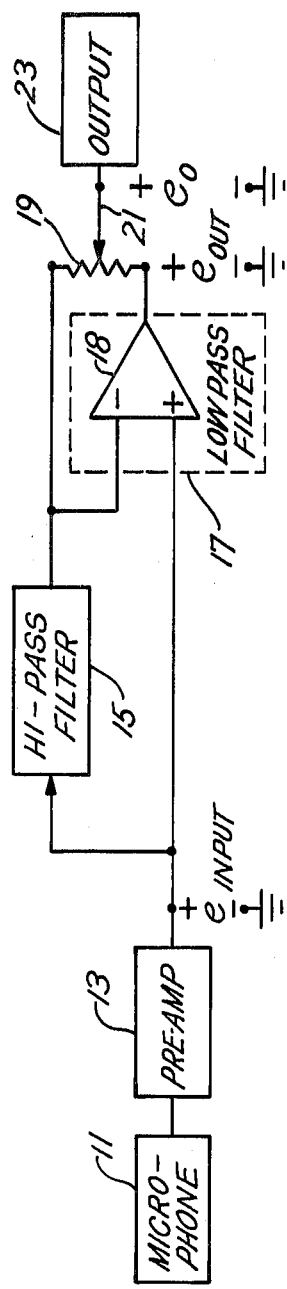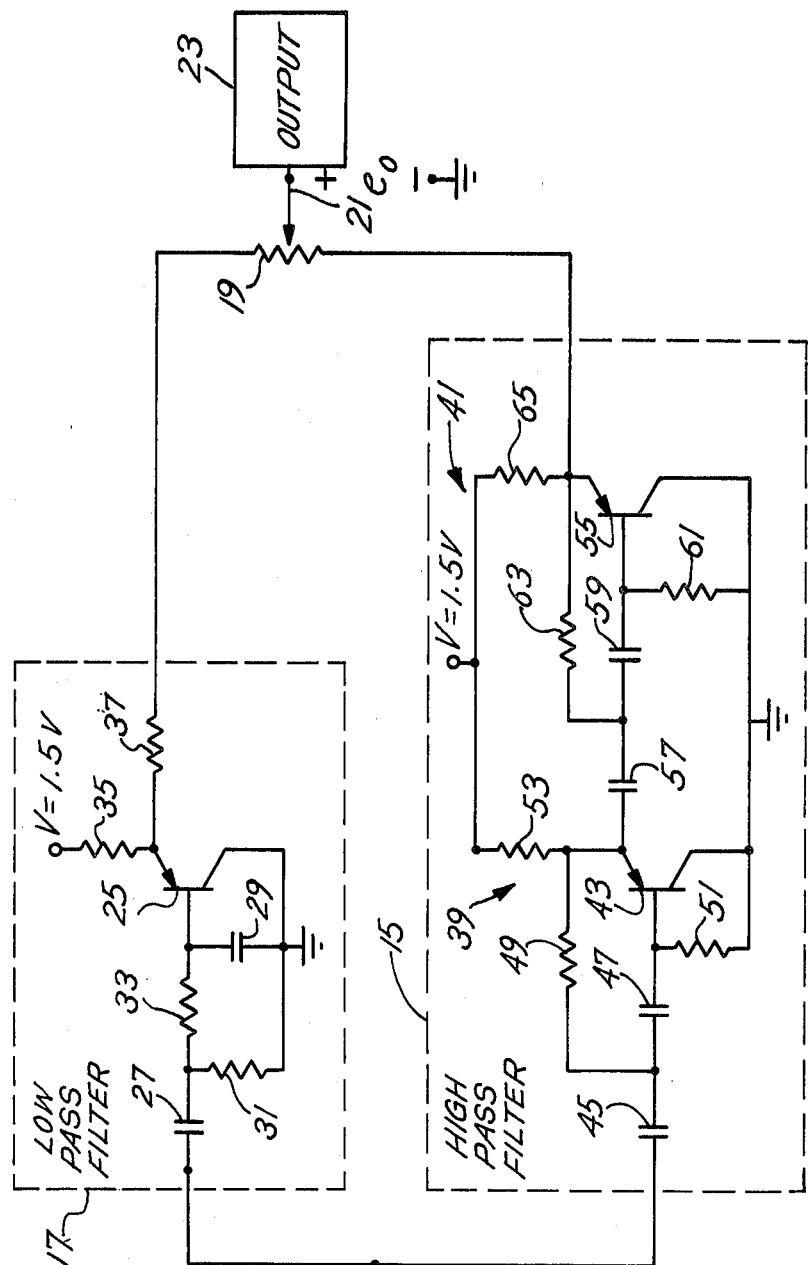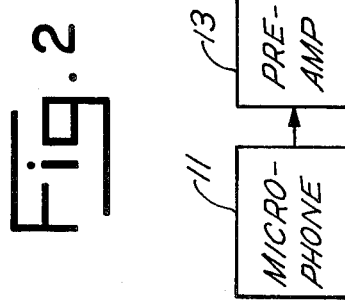

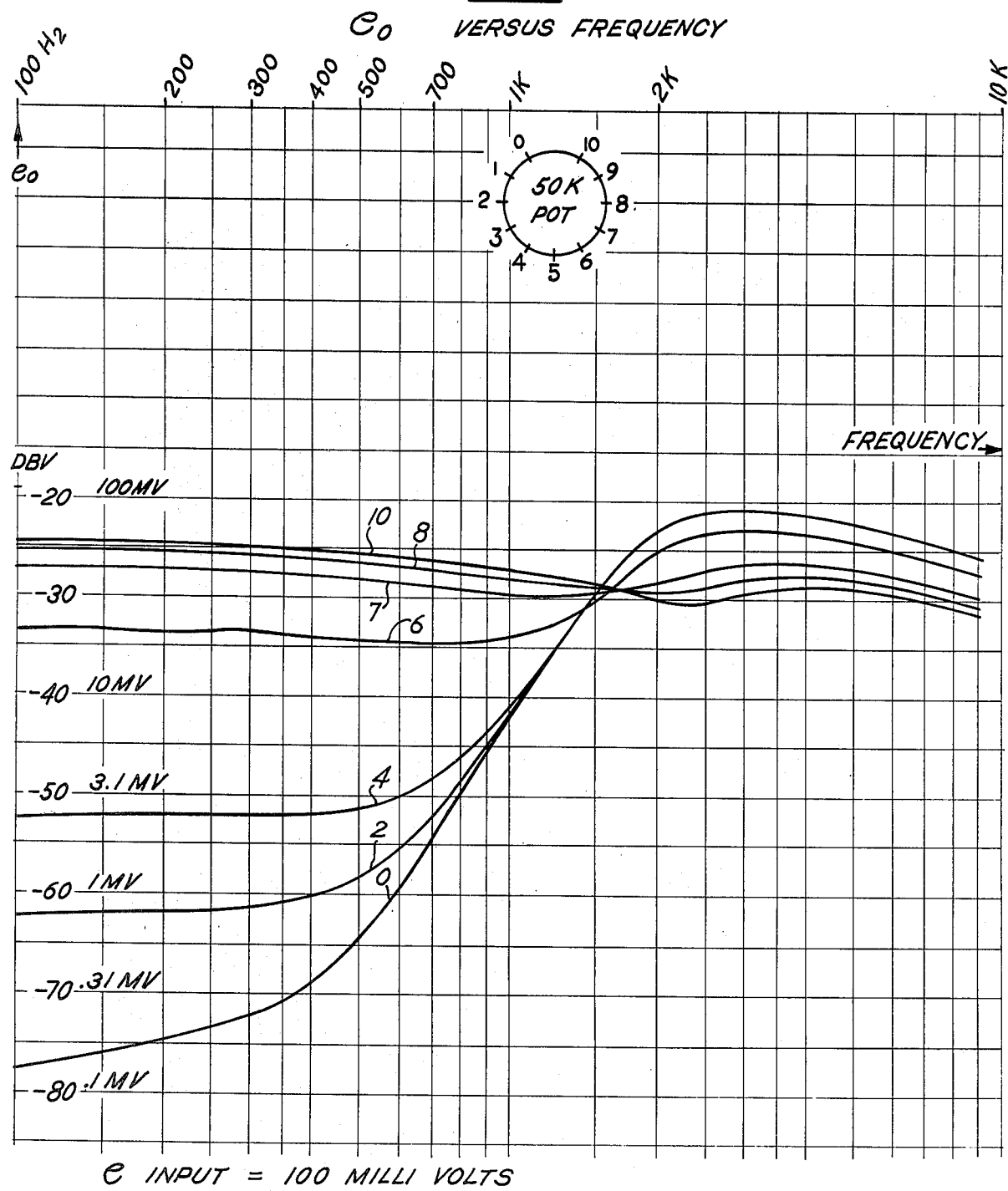

HEARING AID WITH CONTROLLABLE WIDE RANGE OF FREQUENCY RESPONSE

BACKGROUND OF THE INVENTION

The present invention relates to an improved hearing aid and more particularly to a hearing aid in which the frequency response is controllable over a wide range for better establishing the response of the hearing aid to the hearing of the wearer.

Prior art hearing aids include a small amount of adjustment with respect to frequency response of the hearing aid system. The hearing aid industry has recognized for some time that hearing aid characteristics with respect to frequency response need to cover a wide range in order to accurately correct for hearing problems of the wearers of hearing aids. However, it has been difficult to provide a sufficiently wide range of response within a single hearing aid. Therefore, different hearing aid models have been produced for different ranges in order to provide the user with a model best suited for his particular hearing condition. The normal frequency spread for hearing is frequencies in the range of 150 hertz to 7,000 hertz.

The biggest hearing loss of users is due to aging. This bearing loss for the average person occurs in the high frequency range. Therefore, audio signals in the high frequency range need to be amplified relative to signals in the low frequency range. With some people a small amplification of high frequency signals is needed; with others a large amplification is necessary. Also, it has been found that the transition where the hearing loss occurs is a sharply defined transition, generally in 1-2 kilohertz range.

With these problems in mind, it is highly desirable to find a hearing aid system which has its frequency response controllable over a wide range. More particularly, it would be highly advantageous if such a wide range of frequency response were adjustable by a single control.

Therefore, it would be highly desirable to provide a circuit which provides an adjustable relationship of gain of the high end relative to the low end of the audio frequency spectrum by adjustment of a single control. Such a circuit must operate within the volume confines of a normal hearing aid and be suitable for a wide variety of hearing losses.

It is therefore an object of the present invention to improve the frequency shaping characteristics of a hearing aid over the present state of the art for the purpose of achieving a closer match of hearing aid frequency response to the desired frequency response of the wearer of the aid, and to do it with the minimum of discontinuities or glitches in the frequency response.

It is yet another object of the present invention to provide a circuit that yields a wide range of frequency response in accordance with the adjustment of a single control.

SUMMARY OF THE INVENTION

These and other objects of the invention are achieved in a circuit comprising a high pass filter and a low pass filter, the outputs of each of which are individually added together in proportional quantities. In a preferred embodiment of the invention, the proportional quantities are established by a single control.

BRIEF DESCRIPTION OF THE DRAWINGS

FIG. 1 is a partial block diagram and circuit schematic of one embodiment of the present invention.

FIG. 2 is a partial block diagram and circuit schematic of a second embodiment of the present invention.

FIG. 3 is a graph illustration representative of amplification versus frequency in connection with the response of the second embodiment of FIG. 2 ($e_o$ versus frequency for a constant $e_{input}$).

DESCRIPTION OF THE PREFERRED EMBODIMENTS

Referring to FIG. 1, voice and other sound waves to be listened to by the hearer are picked up by a microphone 11 which is positioned in a hearing aid (not shown) in a conventional fashion. As understood, the basic components of a hearing aid include a housing, a battery, an amplifier, a volume control, a microphone and a receiver.

Microphone 11 passes an electrical signal representative of the soundwaves to a conventional preamplifier 31. Preamplifier 13 amplifies the signal and passes the signal to a high pass filter 15 and to a low pass filter 17 where the signal is filtered with respect to various frequencies. High pass filter 15 and low pass filter 17 generate their output signals across a potentiometer 19 where the signals are combined. The potentiometer 19 is adjustable for controlling the proportion of signals from filters 15, 17 which are summed and then fed along a conductor 21 to an output circuit 23. Output circuit 23 includes a conventional hearing aid receiver which is positioned within the ear of the hearer.

The high pass filter comprises a 4-pole filter constructed of two conventional 2-pole Butterworth filters in tandem. The output of such a high pass filter can be represented by the following formula:

$$F(S) = \frac{S^2}{1 + K_1 S + S^2} \times \frac{S^2}{1 + K_2 S + S^2}$$

where $S = jw$ and where $F(S)$ is the frequency response of the high pass filter.

Low pass filter 17 includes a differential amplifier 18 having its inverting input connected to receive the output of the high pass filter and having its non-inverting input connected to preamplifier 13. The output of the differential amplifier is represented by the following:

$$e_{out} = e_{input} - F(S) \times e_{input}$$
$$= e_{input}[1 - F(S)]$$

If the output of the high pass filter 15 and the output of differential amplifier 18 are added together in various proportions, as for example $C_1$ and $C_2$, the final output, $e_o$, developed along conductor 21 is:

$$e_o = C_1 e_{input} F(S) + C_2 e_{input}(1 - F(S)).$$

But where $C_1$ equals $C_2$, then $$e_o = C_2 e_{input}.$$

Thus, the output is flat and all frequency affects are cancelled where $C_1$ equals $C_2$. This circuit has the benefit of eliminating "glitches" in the frequency response in the output signal at the frequencies where the low pass filter and high pass filter meet or overlap.

In some systems, it is more economical and practical to be able to use a single input circuit rather than a differential circuit. This is particularly true with hearing aids where power and size are important factors.

As shown in FIG. 2, a simple RC low pass circuit is utilized in place of the differential amplifier of FIG. 1. It is recognized in the hearing aid of FIG. 1. that the output of the differential amplifier 18 ($e_{input}[1-F(S)]$) is similar to a simple low pass filter having a fall off of 6 DB per octave. That is, $$1 - F(S) = 1 - \frac{S^2}{1 + K_1S + S^2} \times \frac{S^2}{1 + K_2S + S^2};$$

when $S \to \infty$, $1-F(S)$ approaches constant/S which has a slope of 6 DB per octave.

As shown in FIG. 2, low pass filter 17 includes a transistor 25, capacitors 27, 29 and resistors 31, 33, 35 and 37, connected as shown. Low pass filter 17 has a fall off of 6 DB per octave. Transistor 25 operates in an emitter-follower fashion to provide impedance matching as will suggest itself.

Low pass filter 17 passes the low frequency portion and attenuates the high frequency portion of the signal appearing at the output of preamplifier 13. The output of low pass filter 17 is fed to potentiometer 19.

High pass filter 15 includes a pair of like high pass filters 39, 41 connected in tandem. Filter 39 includes a transistor 43, capacitors 45, 47, and resistors 49, 51, 53 connected as shown. High pass filter 41 includes a transistor 55, a pair of capacitors 57, 59, and resistors 61, 63, 65 connected as shown. The two high pass filters 39, 41 pass the high frequency portion and attenuate the low frequency portion of the signal appearing at the output of preamplifier 13. The output of high pass filter 15 is fed to potentiometer 19.

Potentiometer 19 is manually controllable by the operator, for providing to lead conductor 21 different proportions of each of the output signals from filters 15, 17. The different proportions are selected in accordance with position of the wiper of the potentiometer 19. Conductor 21 feeds the output signal to output circuit 23.

The following values are given for the resistors and capacitors of the embodiment of FIG. 2.

| Capacitor 27 | .1 micro farads |
| Capacitor 29 | .0022 micro farads |
| Resistor 31 | 150 K ohms |
| Resistor 33 | 82 K ohms |
| Resistor 35 | 10 K ohms |
| Resistor 37 | 51 K ohms |
| Potentiometer 19 | 50 K ohms |
| Capacitors 45, 57 | .0022 micro farads |
| Capacitors 47, 59 | .0022 micro farads |
| Resistor 49 | 10 K ohms |
| Resistor 51 | 130 K ohm |
| Resistor 53 | 10 K ohms |
| Resistor 61 | 39 K ohms |
| Resistor 63 | 33 K ohms |
| Resistor 65 | 10 K ohms |

Referring to FIG. 3, graphical representation of different frequency response curves are illustrated for different wiper positions of potentiometer 19. As shown in the top portion of FIG. 3, potentiometer 19 is represented as having eleven different resistor positions, i.e., 0 through 10. Frequency response curves for resistive positions 0, 2, 4, 6, 7, 8 and 10 are identified in FIG. 3.

As shown in FIG. 3, the curve for resistive position 0 indicates that as the frequency of the audio signal increases, amplification of high frequency signals is greater than that of low frequency signals. More particularly, a sharp transition in amplification occurs in the center of the graph around the one kilohertz range. This closely matches the sharp transition which occurs with hearing loss.

As potentiometer 19 is adjusted to other resistive positions, the frequency response curve begins to provide smaller amounts of amplification differentials between high frequency and low frequency signals. As understood, many more frequency response curves will be located on the graph of FIG. 3 in accordance with the adjustability of potentiometer 19.

It is to be understood, of course, that the foregoing relates to preferred embodiments of the invention and changes may be made therein without departing from the spirit or scope of the invention as defined by the claims.

What is claimed is:

1. A hearing aid having a wide range of frequency response, comprising:
    microphone input means responsive to sound waves for generating an electrical signal representative of the sound waves;
    high pass filter means for filtering said electrical signal, said high pass filter means generating a first signal representative of the high frequency portions of said electrical signal;
    low pass filter means receiving both said electrical signal and said second signal, said low pass filter means generating a second signal representative of the amplitude subtraction of said last named signals;
    proportioning means combining a selected amplitude portion of said first signal with a selected amplitude portion of said second signal for generating an output signal, said proportioning means minimizing frequency effects in said output signals in the frequency range where said high pass filter means and low pass filter means overlap,
    control means connected to said proportioning means and manually adjustable for controlling the selected amplitude portions of said first and said second signals; and
    output means responsive to said output signal for enhancing the hearing of sound waves by a wearer of the hearing aid.

2. A hearing aid according to claim 1 wherein said proportioning means includes:
    a first input for receiving said first signal;
    a second input for receiving said second signal; and
    an output for outputting said output signal.

3. A hearing aid according to claim 2 wherein said proportioning means includes a sole potentiometer connected between said first and said second inputs, said potentiometer having a wiper connected to said output terminal.

4. A hearing aid according to claim 3 wherein said control means includes a sole control connected to the wiper of said potentiometer for adjusting the position of said wiper.

5. A hearing aid according to claim 1 wherein said low pass filter includes a differential amplifier, the non-inverting input of said differential amplifier connected to receive said electrical signal and the inverting input of said differential amplifier connected to receive said first signal.

* * * * *